United States Patent [19]

Sugiyama et al.

[11] Patent Number: 5,235,623
[45] Date of Patent: Aug. 10, 1993

[54] ADAPTIVE TRANSFORM CODING BY SELECTING OPTIMUM BLOCK LENGTHS ACCORDING TO VARIATONS BETWEEN SUCCESSIVE BLOCKS

[75] Inventors: Akihiko Sugiyama; Masahiro Iwadare; Takao Nishitani, all of Tokyo, Japan

[73] Assignee: NEC Corporation, Japan

[21] Appl. No.: 613,122

[22] Filed: Nov. 14, 1990

[30] Foreign Application Priority Data

| Nov. 14, 1989 | [JP] | Japan | 1-297010 |
| Nov. 30, 1989 | [JP] | Japan | 1-312333 |
| Dec. 13, 1989 | [JP] | Japan | 1-324333 |
| Dec. 13, 1989 | [JP] | Japan | 1-324334 |
| Dec. 13, 1989 | [JP] | Japan | 1-324335 |

[51] Int. Cl.$^5$ .............................................. H04B 1/66
[52] U.S. Cl. ..................................... 375/122; 341/67; 381/31
[58] Field of Search ................ 375/122; 358/138, 426; 341/61, 67, 118, 141; 381/29, 30, 31; 370/82, 83, 118

[56] References Cited

U.S. PATENT DOCUMENTS

| 4,394,774 | 7/1983 | Widergren et al. | 341/61 |
| 4,860,313 | 8/1989 | Shpiro | 341/61 |
| 5,109,417 | 4/1992 | Freider et al. | 375/122 |

OTHER PUBLICATIONS

"Adaptive Transform Coding of Speech Signals", Rainer Zelinski and Peter Noll, IEEE Transactions on Acoustics, Speech, and Signal Processing, vol. AS-SP-25, No. 4, Aug. 1977.

"Approaches to Adaptive Transform Speech Coding at Low Bit Rates", Rainer Zelinski and Peter Noll, IEEE Transactions on Acoustics, Speech, and Signal Processing, vol. ASSP-27, No. 1, Feb. 1979.

Primary Examiner—Curtis Kuntz
Assistant Examiner—T. Ghebretinsae
Attorney, Agent, or Firm—Ostrolenk, Faber, Gerb & Soffen

[57] ABSTRACT

Subblocks of input digital samples are stored into a buffer at frame intervals and segmented into blocks having an integral multiple of the length of the subblock. Each block is encoded into transform coefficients and stored into a memory. Each coefficient is squared and those of the squared transform coefficients which correspond to high-frequency components of the input digital samples are summed and a minimum value is detected therefrom as corresponding to an optimum block length. Those transform coefficients which correspond to the optimum block length are selected from the memory and multiplexed with a signal representative of the optimum block length. In a modification, interblock differences are detected between successive transform coefficients of equal block length and squared. Those of the squared interblock differences which correspond to equal block length are summed, producing a set of squared sums for each block length. A variation is detected between a representative squared sum of a given set and a representative squared sum of a successive set to identify a block length which corresponds to the variation as an optimum block length.

53 Claims, 10 Drawing Sheets

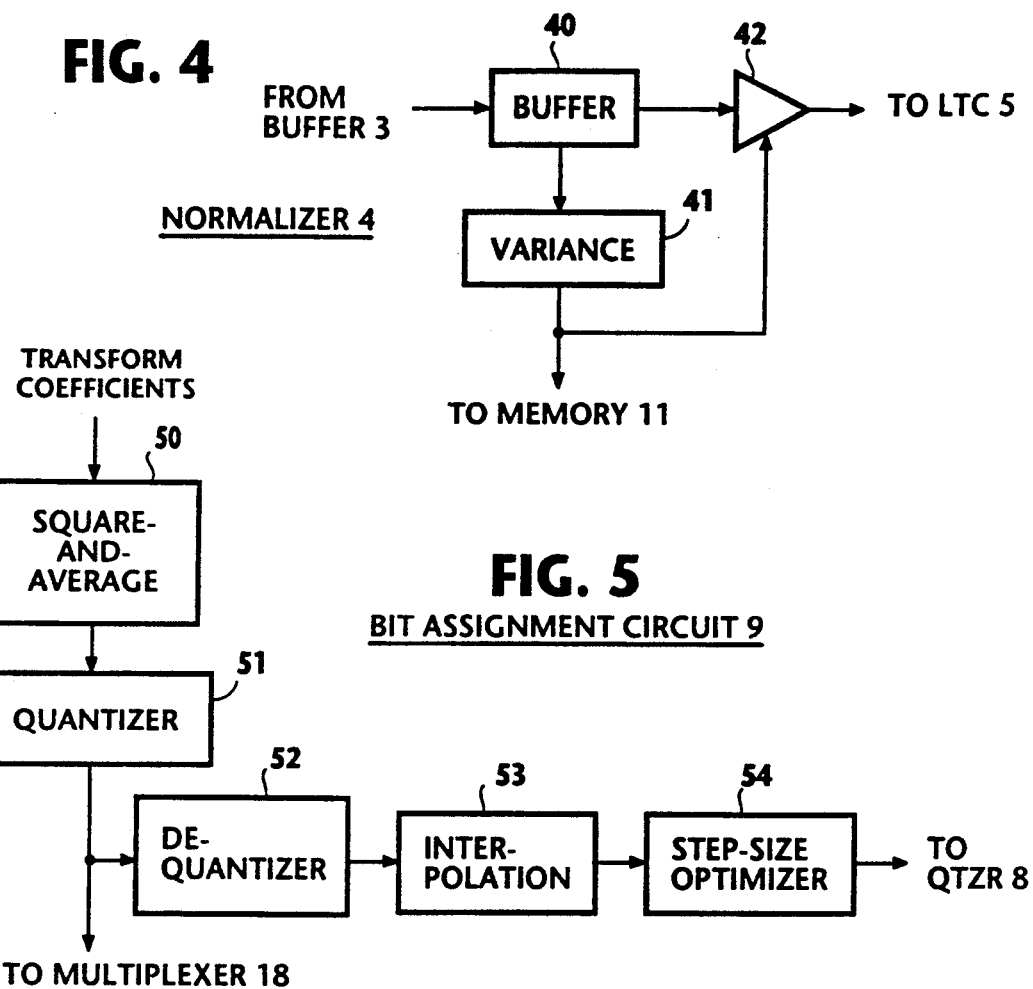
FIG. 4
NORMALIZER 4
FIG. 5
BIT ASSIGNMENT CIRCUIT 9
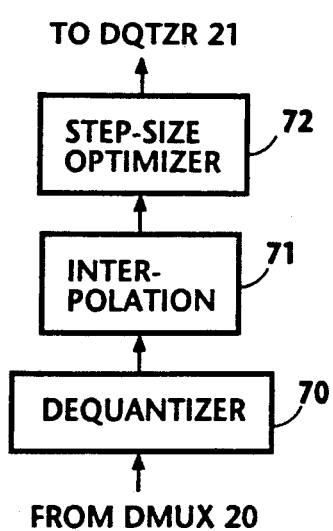
FIG. 8
BIT ASSIGNMENT CKT 22
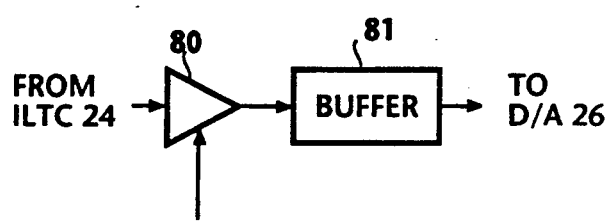
FIG. 9
DENORMALIZER 25

DIFFERENCE DETECTOR 90

ADAPTIVE TRANSFORM CODING BY SELECTING OPTIMUM BLOCK LENGTHS ACCORDING TO VARIATONS BETWEEN SUCCESSIVE BLOCKS

RELATED APPLICATION

The present invention is related to U.S. Pat. No. 5,166,686, filed Jun. 29, 1990 and assigned to the same assignee as this application.

BACKGROUND OF THE INVENTION

The present invention relates to a bandwidth compression techniques for digital audio signals using an adaptive transform coding and decoding method.

Adaptive differential pulse-code modulation (ADPCM) technique is known as a practical way of bandwidth compression and has been extensively used in digital communications. Another bandwidth compression technique that is attractive for audio frequency signals is adaptive transform coding scheme (ATC). As described in "Adaptive Transform coding of Speech Signals", IEEE Transactions on ASSP, Vol. 25, No. 4, 1977, pages 299-309, and "Approaches to Adaptive Transform Speech Coding at Low Bit Rates", IEEE Transactions on ASSP, Vol. 27, No. 1, 1979, pages 89-95, input discrete speech samples are buffered to form a block of N speech samples each. The N samples of each block are linearly transformed into a group of transform coefficients based on a linear transform. These transform coefficients are then adaptively quantized independently and transmitted. The adaptation is controlled by a short-term basis spectrum that is derived from the transform coefficients prior to quantization and transmission, and that is transmitted as a supplementary signal to the receiver. Specifically, the short-term basis spectrum is obtained by a bit assignment process in which quantization bits are assigned corresponding to the amplitude of the transform coefficients. At the receiver, the quantized signals are adaptively dequantized in response to the supplementary signal, and an inverse transform is taken to obtain the corresponding block of reconstructed speech samples.

With an increasing value of block length N, the linear transform coding and decoding processes have increasing power of resolution with a resultant decrease in errors, and the amount of information contained in the supplementary signal decreases with the increase in block length N. This implies that for a given transmission rate a greater amount of data can be transmitted, and hence, it can lead to a quality improvement of coded signals. This is true for speech samples which can be considered as being steady for an interval corresponding to block length N. However, with samples having a rapidly changing characteristic in amplitude, phase and/or frequency, a larger value of block length does not necessarily result in small errors. Thus, it is desirable that block length N be as large as possible for signals of more stable nature to increase resolution, but as small as possible for less stable signals keep track of their changing characteristics. These conflicting requirements cannot be satisfied simultaneously by the prior art uniform block length approach.

SUMMARY OF THE INVENTION

It is therefore an object of the present invention to provide variable length block, adaptive transform coding of digital samples representing an underlying audio-frequency analog waveform such as speech and music signals.

According to a first aspect of the present invention, subblocks of input digital samples representing an audio-frequency signal are stored in a buffer at predetermined intervals and the stored samples are segmented into a plurality of blocks each having an integral multiple of length of the subblock. Each of the blocks is encoded into corresponding transform coefficients, which are stored into a memory. Each of the stored transform coefficients is squared and those of the squared transform coefficients which correspond to high-frequency components of the input digital samples are summed to produce squared sums. A minimum value is detected from the squared sums as corresponding to an optimum block length. Those of the transform coefficients which correspond to the optimum block length are selected from the memory and multiplexed with a block length signal representative of the optimum block length.

According to a second aspect, interblock differences are detected between successive transform coefficients of equal block length and squared. Those of the squared interblock differences which correspond to equal block length are summed to produce a set of squared sums for each block length. Representative values of the squared sums are detected from successive ones of the sets and a variation is detected between the representative values to identify a block length which corresponds to the detected variation as an optimum block length.

According to a third aspect, subblocks of input digital samples representing an audio-frequency signal are stored in a buffer at frame intervals, segmented into blocks each having an integral multiple of the length of the subblock. These blocks are stored into a memory and interblock differences are detected between successive blocks of equal length. Each interblock difference is squared and those of the squared interblock differences which correspond to equal block length are summed, producing sets of squared sums for each frame interval. Representative values of the squared sums are detected from successive ones of the sets and a variation is detected between the representative values to identify a block length which corresponds to the detected variation as an optimum block length. Those of the blocks having the optimum block length are selected from the memory and encoded into corresponding transform coefficients, which are multiplexed with a block length signal representative of the optimum block length.

BRIEF DESCRIPTION OF THE DRAWINGS

The present invention will be described in further detail with reference to the accompanying drawings, in which:

FIG. 4 shows details of the normalizer of FIG. 1;

FIG. 5 shows details of the bit assignment circuit at the transmitter;

FIG. 8 shows details of the bit assignment circuit at the receiver of FIG. 1;

FIG. 9 shows details of the denormalizer at the receiver of FIG. 1;

DETAILED DESCRIPTION

Figure 1:
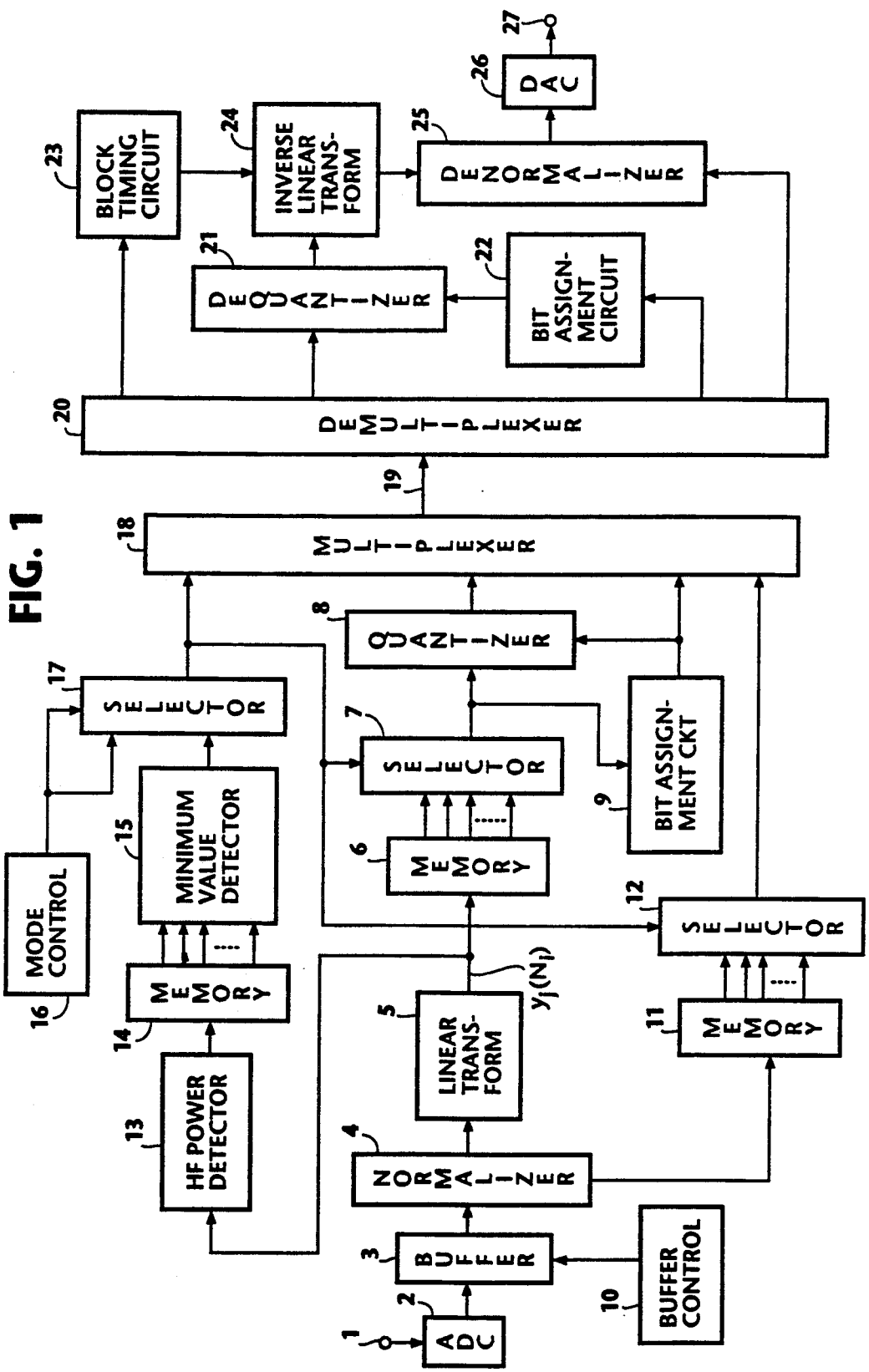
FIG. 1 shows in block form a digital communications system incorporating a variable block length, adaptive linear transform coding/decoding scheme according to a first embodiment of the present invention.

Referring now to FIG. 1, there is shown a data compression system employing an adaptive linear transform coding and decoding method according to a first embodiment of the present invention for telecommunication or storage applications. In the illustrated embodiment, the system is shown as a communications system. At the transmit end of the communications system, an analog audio-frequency signal, either speech or music, is applied through an input terminal 1 to an A/D converter 2 in which it is sampled at the Nyquist rate and quantized into digital samples and fed to a buffer 3. In a manner as will be fully described, a buffer controller 10 is provided to continuously write input digital samples into buffer 3 and read stored samples at such intervals that digital samples are formed into a series of different block lengths which are an integral multiple of N samples, i.e. N, 2N, ... $2^l N$, (where $l=1, 2 ... m$). In the illustrated embodiment, each successive group of 4N input samples is sequentially divided into blocks of N, 2N and 4N output samples.

Figure 2:
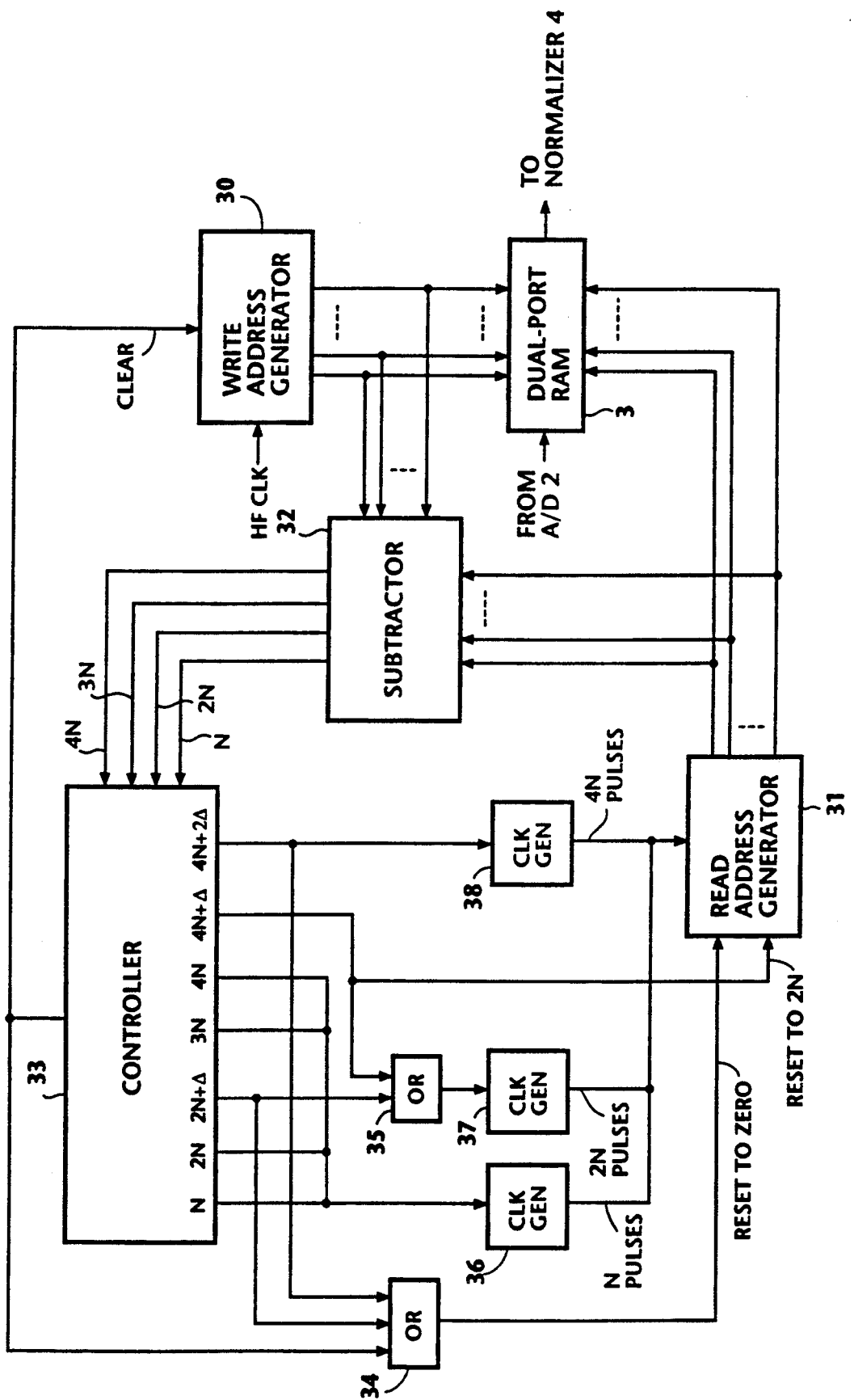
FIG. 2 shows in block form details of the buffer controller of FIG. 1.

Details of buffer controller 10 are illustrated in FIG. 2. A successive group of 4N input samples each is stored into buffer 3 which is implemented by a dual-port random access memory. Buffer controller 10 includes a write address generator 30 and a read address generator 31 for generating write and read addresses for RAM 3. A subtracter 32 is connected to the outputs of address generators 30 and 31 to detect the amount of samples stored in RAM 3 by making a comparison between the write and read addresses. Subtracter 32 generates four output signals on respective leads N, 2N, 3N and 4N when the stored sample count reaches N, 2N, 3N and 4N, respectively. The outputs of subtracter 32 are fed to a controller 33 having output terminals designated N, 2N, 2N+$\Delta$, 3N, 4N, 4n+$\Delta$, and 4N+2$\Delta$. The output terminals N, 2N 3N and 4N of controller 33 are coupled together to a clock generator 36 which generates N clock pulses in burst form, and the output terminals 2N+$\Delta$ and 4N+$\Delta$ are coupled through an OR gate 35 to a clock generator 37 which generates 2N clock pulses. The output terminal 4N+2$\Delta$ of controller 33 is connected to a clock generator 38 which generates 4N clock pulses. The outputs of clock generators 36, 37 and 38 are coupled to the count input of the read address generator 31. The read address generator 31 is reset to zero count in response to a signal from the output terminal 2N+$\Delta$ and 4N+2$\Delta$ which are connected through an OR gate 34. Address generator 31 is further reset to a 2N count in response to a signal from the 4N+$\Delta$ output terminal of controller 33. At periodic intervals, controller 33 supplies a clear pulse to write address generator 30 to discard all samples in RAM 3 to refill it with new input samples. This clear pulse is also applied to the read address generator 31 via OR gate 34.

Figure 3:
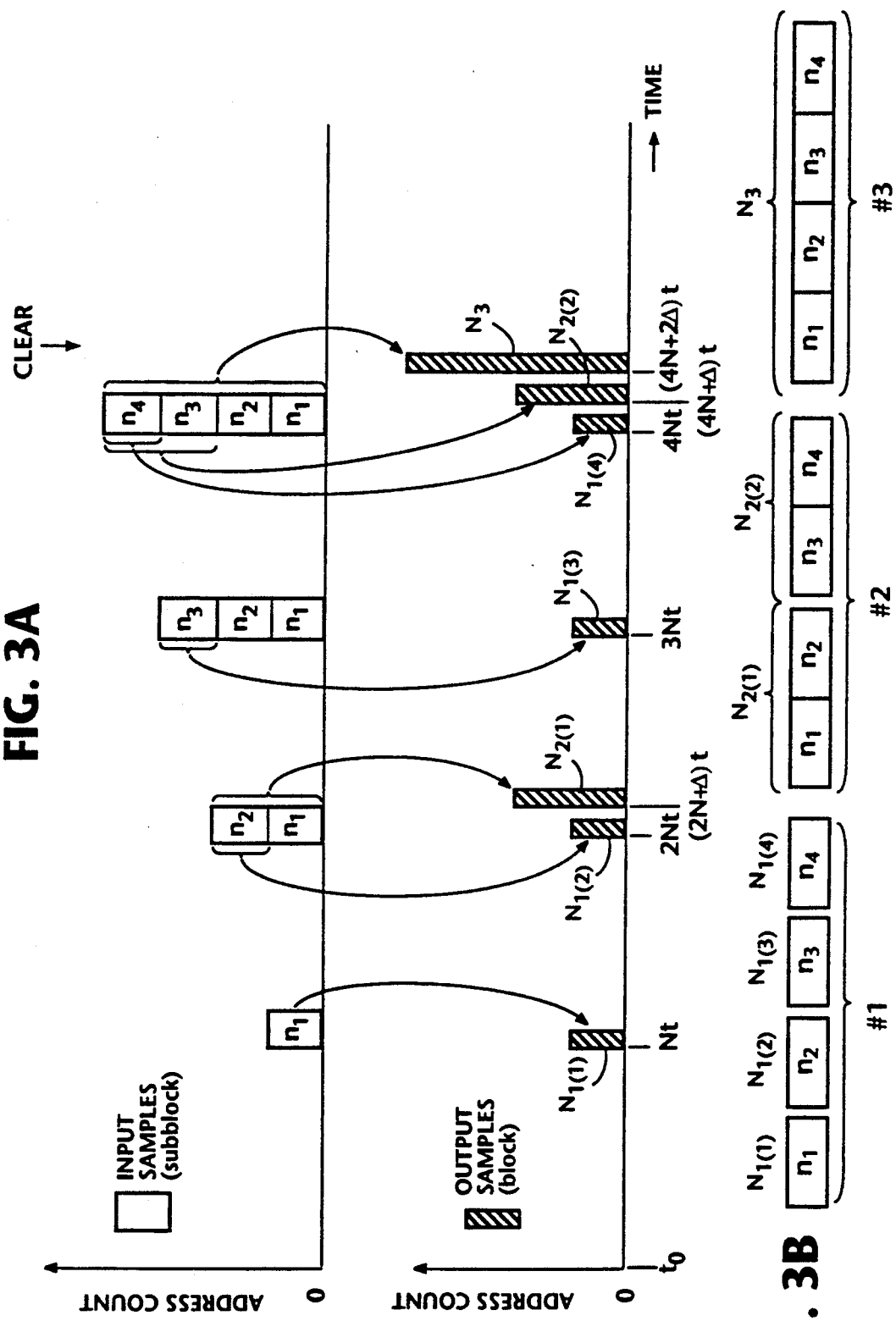
FIGS. 3A and 3B show a sequence of input and output digital samples.

The operation of buffer controller 10 will be understood with reference to FIGS. 3A and 3B. At Nt intervals, N input samples are periodically supplied from A/D converter 2 to RAM 3 as a unit called a "subblock" and stored samples are read out of RAM 3 as a unit called a variable-length block, or simply "block" which is an integral multiple of the length of subblock. At 4Nt, or "frame" intervals, a clear pulse is applied to both address generators to clear all samples stored in RAM 3. At time $t_0$, a clear pulse is supplied to both address generators, and at time Nt, N input samples are stored as a first subblock $n_1$ into RAM 3. Subtracter 32 supplies an output on lead N to controller 33 to cause it to apply an output to its output terminal N. Clock generator 36 is enabled by controller 33 to supply N clock pulses to the read address generator 31 to read the first subblock $N_{1(1)}$ from RAM 3 as a unit called "block", i.e., a first block $N_{1(1)}$ of N output samples (i.e., one subblock length).

At time 2Nt, input samples are stored as a second subblock $n_2$ into RAM 3 and subtracter 32 generates an output signal on lead 2N. In response to this signal, controller 33 enables clock generator 36 through its output terminal 2N so that the read address generator 31 is incremented further by a 2N count value to read the stored second subblock $n_2$ as a second block $N_{1(2)}$ of N output samples. Subsequently at time (2N+$\Delta$)t, controller 33 enables clock generator 37 through its 2N+$\Delta$ output terminal and OR gate 35 to supply 2N clock pulses to the read address generator 31 in order to read first subblock $n_1$ and second subblock $n_2$ simultaneously as a first block $N_{2(1)}$ of two-subblock length.

At time 3Nt, a third subblock $n_3$ is stored in RAM 3 and subtracter 32 produces an output signal on lead 3N. Controller 33 applies a signal to the 3N output terminal to enable clock generator 36. The read address generator 31 is thus incremented by N count from the previous 2N count value and the third subblock $N_{1(3)}$ is read out of RAM 3 as a third block $N_{1(3)}$ of N output samples.

At time 4Nt, a fourth subblock $N_{1(4)}$ is stored in RAM 3 and subtracter 32 produces an output signal on lead 4N. Controller 33 applies a signal to the 4N output terminal to enable clock pulse generator 36. The read address generator 31 is thus incremented further by N count from the previous 3N count value and the fourth subblock $n_4$ is read out of RAM 3 as a fourth block $N_{1(4)}$ of N output samples. In succession to this, controller 33 sequentially applies a signal to its 4N+$\Delta$ output terminal to cause clock generator 37 to supply 2N clock pulses to the read address generator 31 as well as to its reset-to-2N input terminal. Thus, the address generator 31 is incremented by a 2N count from the previous 2N address count to read the third and fourth subblocks $N_{1(3)}$ and $N_{1(4)}$ as a second block $N_2(2)$ of 2N output samples. Controller 33 then applies a signal to its 4N+2$\Delta$ output terminal. This signal resets the address generator 31 to zero and causes clock generator 38 to increment the read address generator 31 by a 4N count from zero. As a result, the first through fourth subblocks $n_1$, $n_2$, $n_3$ and $n_4$ are read out of RAM 3 as a block $N_3$ of four-subblock length.

Controller 33 then clears the write and read address generators to repeat the above process to successively store next four subblocks of input samples and read seven variable length blocks. It is seen from FIG. 3A that each sequence of seven blocks of different lengths contains an equal number of subblocks of successive arrivals, i.e., three subblocks of first arrivals, three subblocks of second arrivals, three subblocks of third arrivals and finally three subblocks of fourth arrivals. The stored samples are therefore divided into seven blocks of N, N, 2N, N, N, 2N and 4N output samples, and are cleared at frame intervals when a total of twelve output subblocks are derived from every four input subblocks. In other words, each 4N input sample sequence is converted to a first set of four blocks of single-subblock length each, a second set of two blocks of two-subblock length, and a third set, or a single block of four-subblock length as illustrated in FIG. 3B. Thus, at frame intervals, a series of sets of blocks of different block lengths $N_i(1 \leq i < n$, where n is the longest block length) appears at the output of buffer 3 and same subblocks repeatedly appear in each set.

The output of buffer 3 is applied to a normalizer 4. The effect of normalizer 4 is to cause a linear transform coder 5 to produce an output whose value is not dependent on the power level of the input signal. As shown in FIG. 4, normalizer 4 comprises a buffer 40, a variance calculator 41 and a scaler 42. Samples of each variable-length block from buffer 3 are stored into buffer 40 and the variance of each block is calculated to produce a signal representative of an average power of each block. The output of variance calculator 41 is supplied to a memory 11 and to the scaler 42 to modify the values of the samples stored in buffer 40 according to the variance.

Linear transform coder 5 is connected to the output of scaler 42 to provide linear transform coding on each variable-length block of the scaled samples to encode the normalized digital samples of each block into corresponding linear transform coefficients, which are supplied to a memory 6 and to a high-frequency power detector 13. Linear transform coder 5 includes circuitry that analyzes the frequency of the normalized samples and rearranges the transform coefficients of each block so that those of the transform coefficients in each block which occur earlier in that block correspond to the lower frequency components of the input samples and those which occur later in that block correspond to the higher frequency components of the input samples. For convenience, each transform coefficient is represented as $y_j\{(N_i)\}$, where $j = 1, 2, \ldots k$ (where k is an integer representing block length $N_i$) and $y_1$ corresponds to the transform coefficients corresponding to the lowest frequency input samples and $y_n$ corresponds to the transform coefficients corresponding to the highest frequency input samples. The Walsh-Hadamard transform, the discrete Fourier transform, the discrete cosine transform and the Karhunen-Loéve transform are suitable linear transform coding for this purpose.

Memory 6 has multiple output terminals at which transform coefficients sequentially appear. A selector 7 is connected to the outputs of memory 6 to selectively apply those of the transform coefficients to a quantizer 8 which correspond to a desired block length specified by a block length signal applied from a selector 17.

Quantizer 8 includes quantizer elements for successively quantizing the transform coefficients using an optimum number of bits supplied from bit assignment circuit 9 whose function is to minimize squared errors resulting from the quantization process. FIG. 5 shows details of bit assignment circuit 9 as comprising a square-and-average circuit 40 in which squared values of the transform coefficients are derived from each variable-length block supplied from linear transform circuit 21, and an average value of neighboring M squared coefficients (where M is a divisor of N) is taken from each variable-length block as a representative value of the M samples. From each of N squared coefficients L (=N/M) coefficients are therefore derived and supplied to a quantizer 41 in which they are quantized and fed to the data selection and multiplexing circuit 11 and transmitted as supplemental information. On the other hand, the output of quantizer 41 is dequantized by a dequantizer 42 and fed to an interpolator 43 in which the logarithm to the base 2 is taken of the dequantized samples and (M−1) interpolations are provided between successive input samples. The output of interpolator 43 is fed to a step-size optimizer 44 in which the following Equation is calculated:

$$R_i = \overline{R} + 0.5 \log_2 \sigma_i^2 - 0.5N \sum_{n=1}^{N} \log_2 \sigma_n^2 \qquad (1)$$

where, $R_i$ is the number of bits assigned to an i-th transform coefficient, R is the average number of bits assigned to each transform coefficient, and $\sigma_i^2$ is a squared value of the i-th interpolated transform coefficient.

In accordance with a step-size determined by bit assignment circuit 9, the output of selector 7 is quantized and fed to a multiplexer 18 from which the quantized signal is transmitted as main information through transmission line 19.

High-frequency power detector 13 receives a frame of transform coefficients and determines the power $\delta(N_i)$ of those high-frequency components which arise in a range beginning with a transform coefficient corresponding to a predetermined threshold Th and ending with a transform coefficient corresponding to $N_j$ which is represented by the integer k. The power $\delta(N_i)$ is obtained from the following Equation:

$$\delta(N_i) = \frac{1}{N_i} \sum_{j=Th}^{k} y_j(N_i)^2 \qquad (2)$$

where $y_j(N_i)$ represents transform coefficients of block $N_i$, where $1 \leq j \leq i$.

Figure 6:
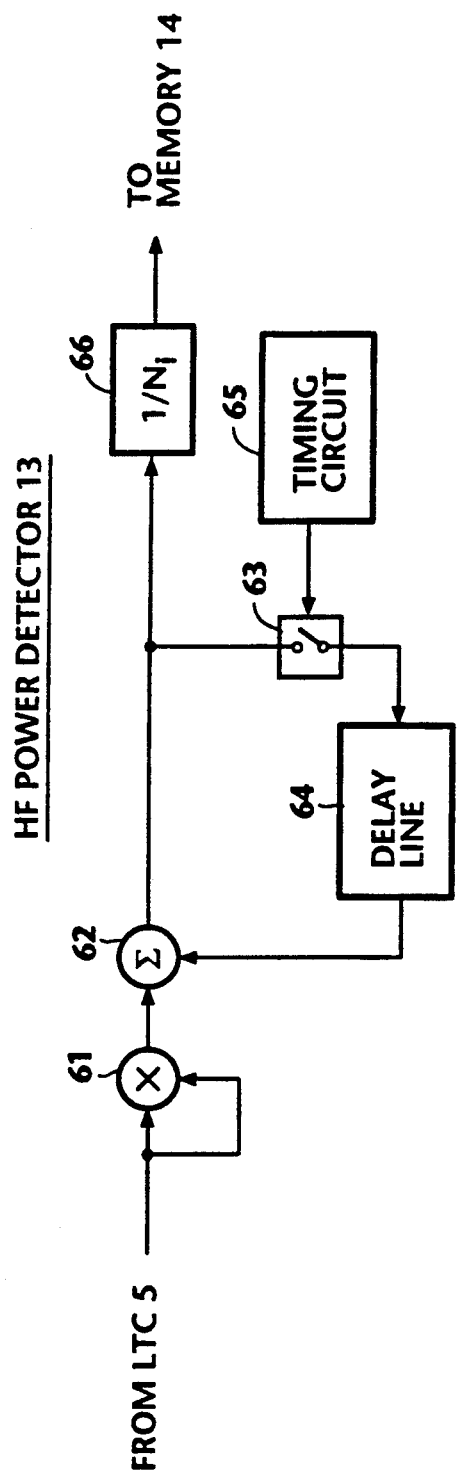
FIG. 6 shows details of the high-frequency power detector of FIG. 1.
Figure 7:
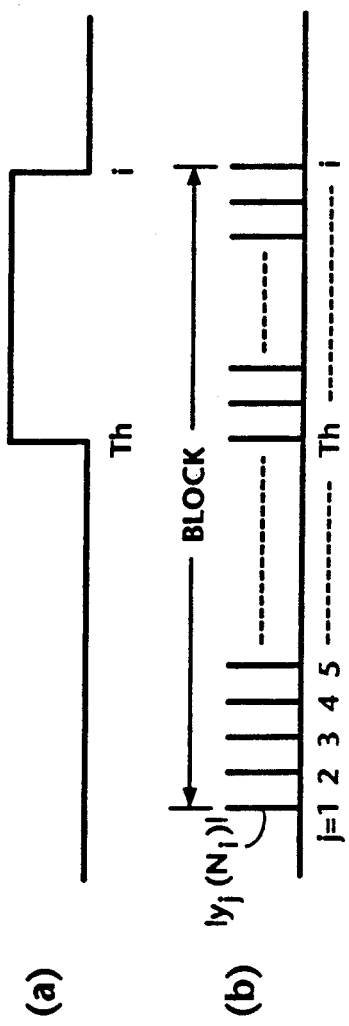
FIG. 7 shows details of signals appearing in the detector of FIG. 6.

As illustrated in FIG. 6, the output of transform coder 5 is applied to a squaring circuit 61 in which it is squared and fed to a first input of an adder 62. The output of adder 62 is coupled to a memory 14 and further through a switch 63 to a delay element 64 in which it is delayed for a sampling interval and fed to the second input of adder 62. A timing circuit 65 responds to a reference timing signal to generate a switching pulse having a duration beginning with a transform coefficient $y_1(N_i)$ that corresponds to the threshold Th and terminating with transform coefficient $y_{th}(N_i)$ as shown in part (a) of FIG. 7. Therefore, those of the squared values of transform coefficients of each block which occur during the period of the switching pulse, as shown in part (b) of FIG. 7, are summed by adder 62 and divided by a factor $1/N_i$ with a divider 66 to produce a normalized power signal $\delta(N_i)$ as a solution of Equation (2) for transform coefficients of equal block length. Therefore, in the example of FIG. 3A, seven squared sums $\delta(N_i)$ of high-frequency components are derived from each frame interval, i.e., four squared sums for $N_1$, two squared sums for $N_2$ and one squared sum for $N_3$.

The squared sum outputs of high-frequency power detector 13 are stored into respective locations of a memory 14 which are coupled through its output terminals to a minimum value detector 15, in which all squared sums $\delta(N_i)$ are searched for a minimum value and the block length $N_i$ of the minimum squared sum is selected as an optimum block length and a signal indicative of this optimum block length is fed to a selector 17.

A mode control circuit 16 is provided to generate a mode-control signal which indicates whether the system is to be operated in a fixed mode in which a specified block length is selected for transmission or in an optimum mode in which an optimum block length is selected for transmission. The output signal of mode control circuit 16 is coupled to selector 17.

During a fixed mode, the output of mode control circuit 16 indicates that the specified block length be selected and a signal indicating the specified block length is unconditionally selected in preference over the output of optimum block length detector 15 and applied to multiplexer 18 as supplemental information and further to control terminals of selectors 7 and 12 as a switching signal. In response to this switching signal, a transform coefficient stored in memory 6 corresponding to the specified block length is read out of the memory by selector 7 and fed to quantizer 8 and a variance indicating signal stored in memory 11 corresponding to the specified block length is read out of the memory by selector 12 and fed to multiplexer 18.

During an optimum mode, the output of mode control circuit 16 indicates that the output of optimum block length detector 15 be selected unconditionally. Thus, a transform coefficient in memory 6 and a variance indicating signal in memory 11 both of which correspond to the optimum block length are read out of the memories by selectors 7 and 12.

At the receive end of the communications system, the multiplexed signal is decomposed by a demultiplexer 20 into individual components. The quantized transform coefficients are demultiplexed and sequentially supplied to a dequantizer 21, and the signal indicating a step-size value derived from the bit assignment circuit 9 is demultiplexed and fed to a bit assignment circuit 22. Further, the variance signal derived by normalizer 4 is demultiplexed and fed to a denormalizer 25.

As shown in FIG. 8, bit assignment circuit 22 comprises a dequantizer 70, an interpolator 72 and a step-size optimizer 72. The demultiplexed step-size value signal is dequantized by dequantizer 70 and fed to interpolator 71 which provides interpolations in much the same way as interpolator 43 at the transmit end of the system. Step-size optimizer 72 also corresponds to the step-size optimizer 44 of the transmitter and determines an optimum quantization step-size by calculating Equation (1). Using the step-size determined by the optimizer 72, dequantizer 21 recovers a replica of the original transform coefficients and supplies it to an inverse linear transform coder 24 whose output is connected to denormalizer 25. The specified or optimum block length signal is demultiplexed by demultiplexer 20 and applied to a block timing circuit 23 in which it is converted to a block timing signal indicating the end of a received block. In response to the block timing signal, inverse linear transform coder 24 performs inverse linear transform on the dequantized transform coefficients to recover a replica of the original digital speech/music samples and applies it to denormalizer 25.

The signal applied to denormalizer 25 is processed in a manner inverse to that of normalizer 4 of the transmitter. As shown in FIG. 9, denormalizer 25 includes a scaler 80 which multiplies the output of inverse linear transform coder 24 by a reciprocal of the demultiplexed variance signal. The output of scaler 80 is fed to a buffer 81 whose output is converted to analog form by a D/A converter 26 to produce a replica of the original analog speech/music signal at an output terminal 27.

Figure 10:
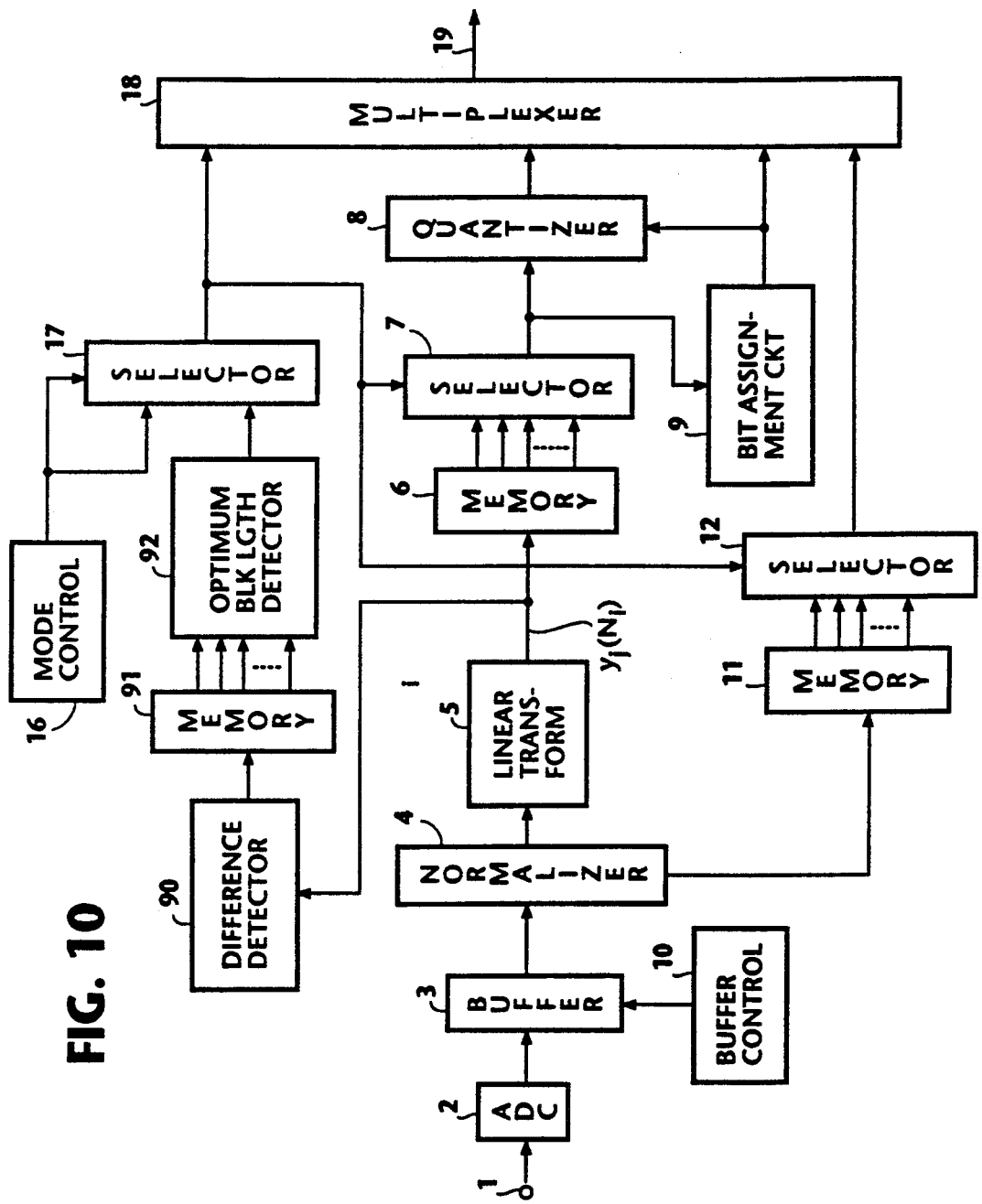
FIG. 10 shows in block form a second embodiment of the present invention.

FIG. 10 shows a modified embodiment of the present invention. In this modification, an interblock difference detector 90, a memory 91 and an optimum block length detector 92 are provided instead of the high-frequency power detector 13, memory 14 and optimum block length detector 15 of FIG. 1. Difference detector 90 generates a signal representative of an interblock difference between those transform coefficients of successive occurrences having equal block length (or equal bit length). The interblock difference is then squared and a squared sum $\delta'(N_i)$ is derived from transform coefficients of equal block length which are represented by $y_i\{(N_i)\}$ (where $1 \leq i \leq n$). In a qualitative term, interblock difference detector 90 calculates the following Equation:

$$\delta'(N_i) = \frac{1}{N_i} \sum_{j=1}^{k} \{y_j(N_i) - z_j(N_i)\}^2 \qquad (3)$$

where $y_j(N_i)$ represents transform coefficients that occur at any given instant of time and $z_j(N_i)$ represents those occurring at an instant one block earlier than the given instant.

Figure 11:
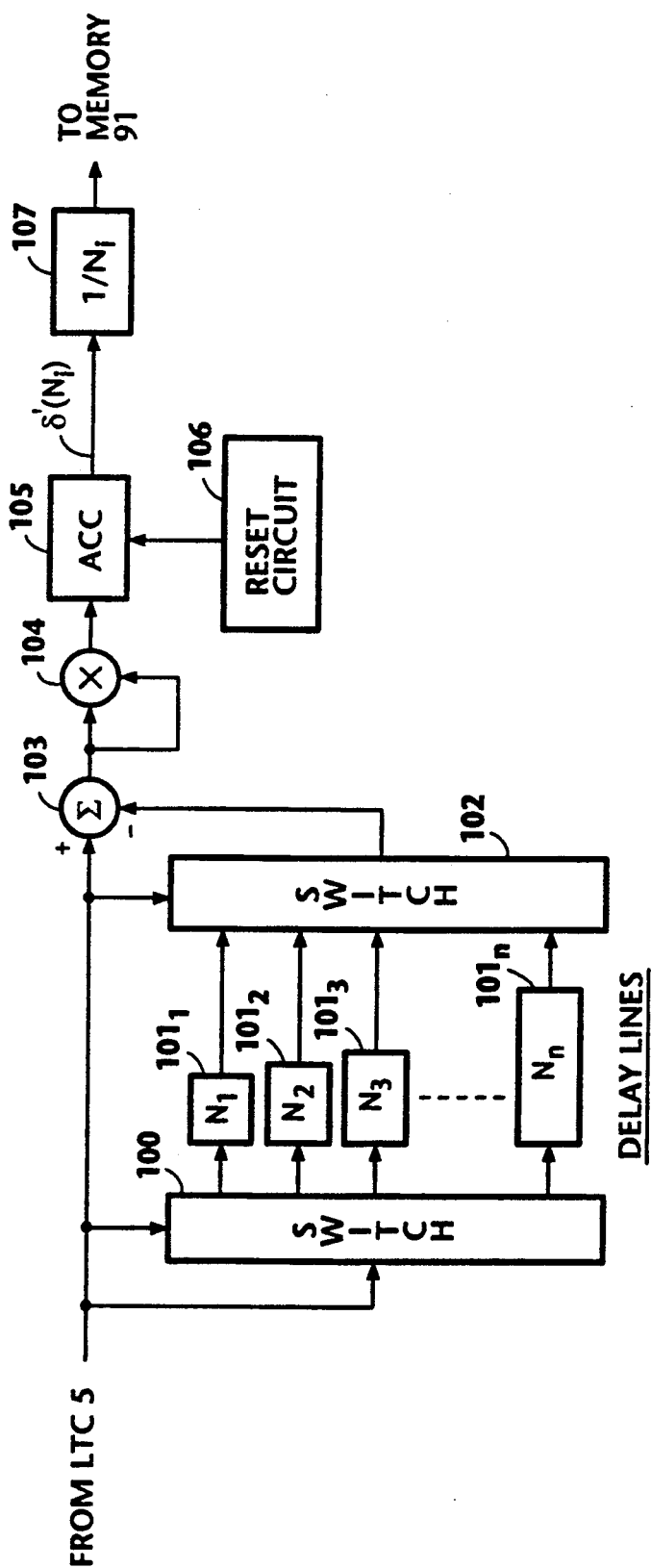
FIG. 11 shows in block form details of the interblock difference detector of FIG. 10.
Figure 12:
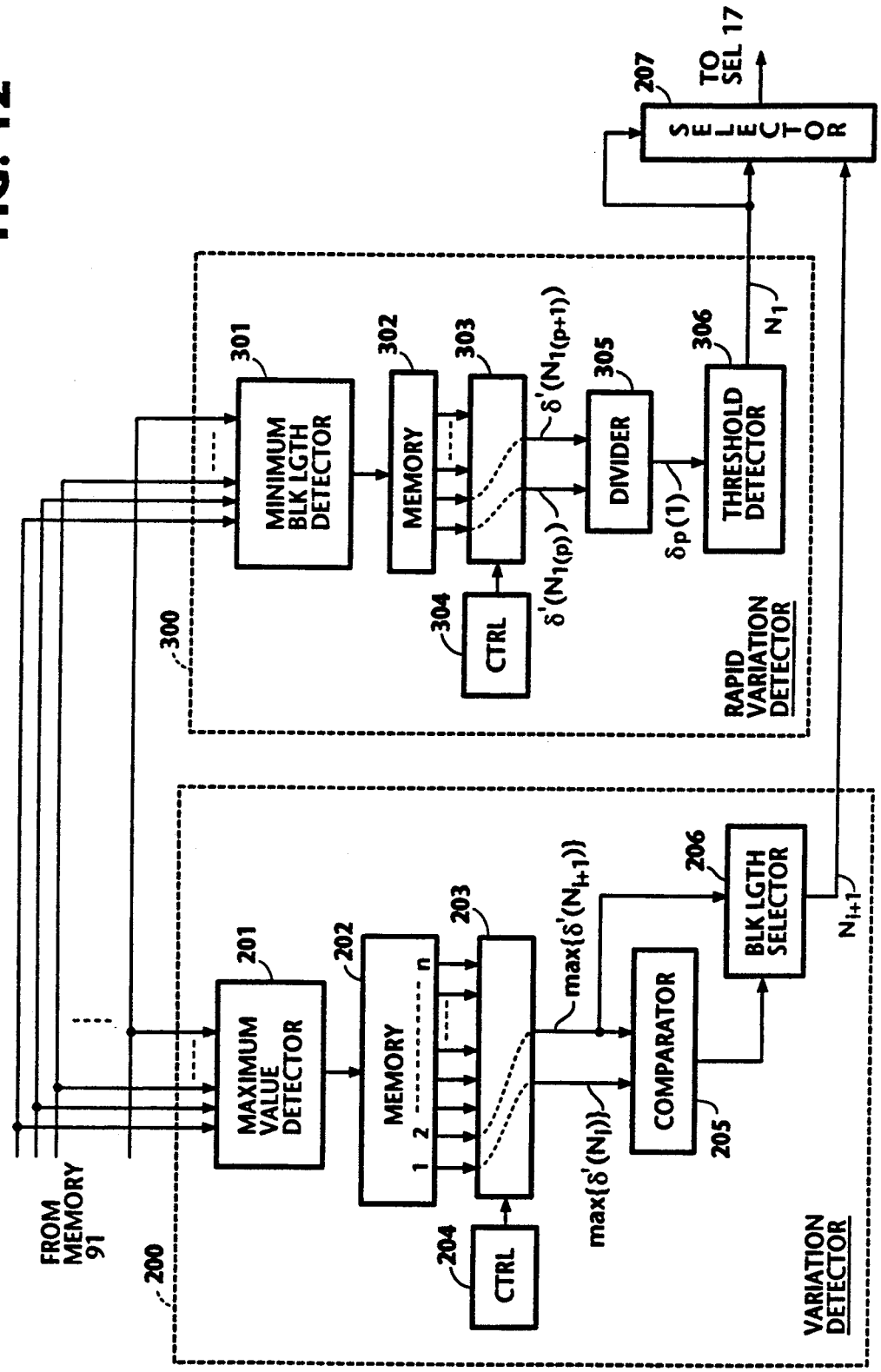
FIG. 12 shows in block form details of the optimum block length detector of FIG. 10.

Details of interblock difference detector 90 and optimum block length detector 92 are respectively shown in FIGS. 11 and 12. In FIG. 11, the output of linear transform coder 5 is connected to the positive input of a subtracter 103. An input switch 100 is provided to respectively store transform coefficients $N_1$ through $N_n$ of each variable set from linear transform coder 5 into tapped delay lines $101_1$ through $101_n$. Each tapped delay line has memory elements corresponding in number to the number of bits of the corresponding transform coefficient. Input switch 100 is further supplied with the output of coder 5 as a switching signal to sequentially establish a path from its input terminal to one of the tapped delay lines according to the value of a transform coefficient appearing at the input terminal. The outputs of tapped delay lines $101_1$ through $101_n$ are coupled through an output switch 102 to the other input of subtracter 103. Output switch 102 is also supplied with the output of coder 5 as a switching signal to establish a path from one of the tapped delay lines to the negative input of subtracter 103. Therefore, when a given transform coefficient $y_j(N_i)$ appears at the positive input of subtracter 103, a previous transform coefficient $z_j(N_i)$ of the same bit length as the length of the given coefficient appears at the negative input of subtracter 103 for making a comparison between them. A transform coefficient having the largest bit length in each frame interval is compared with the corresponding coefficient of an adjacent frame. A signal representative of the interblock difference between the inputs of subtracter 103 is generated and applied to a squaring circuit 104 in which it is squared and applied to an accumulator 105, which is cleared by a reset circuit 106 at intervals corresponding to the length of each successive block. The squared interblock difference values are summed by accumulator 105 and divided by a factor $1/N_i$ with a divider 107 to produce a normalized square sum. Continuing in this way, a set of normalized squared sums is produced for each of the different block lengths as a solution of Equation (3). In the example of FIG. 3A, seven normalized squared sums are derived from seven blocks during each frame interval, i.e., four squared sums from the first set of transform coefficients of block $N_1$, two squared sums from the second set of block $N_2$ and one squared sum from the third set of block $N_3$. Note that the first block each set is compared with the corresponding block of a previous frame.

These seven squared sums from interblock difference detector 90 are sequentially stored into respective locations of memory 91 and appear through its output terminals at the input terminals of optimum block length detector 92.

In FIG. 12, optimum block length detector 92 comprises generally a variation detector 200 and a rapid variation detector 300. Variation detector 200 includes a maximum detector 201, which is coupled to the outputs of memory 91 to search for a maximum value $\max\{\delta'(N_i)\}$ from each set of squared sums of interblock differences stored therein during each frame interval. Namely, in the above example, a first maximum value is detected from the four squared sums of the first set of blocks $N_1$, a second maximum value is detected from the two squared sums of the second set of block $N_2$ and the squared sum of the third set $N_3$ is detected as a third maximum value. A set of these maximum values are stored into respective locations of a memory 202 which appear at the output terminals thereof. In this way, a plurality of sets of maximum values are derived from successive frame intervals. The outputs of memory 202 are applied to a switch 203 which is driven by a controller 204 to sequentially couple a successive pair of adjacent inputs from memory 202 to a comparator 205, starting with the maximum value corresponding to minimum block length $N_1$, to determine if the adjacent inputs of any pair satisfy the following relation:

$$\max\{\delta'(N_i)\} \geq \max\{\delta'(N_{i+1})\} \tag{4}$$

where $1 \leq i < n-1$. It is seen from Equation (4), comparison is made between maximum values detected respectively from the different sets of each frame interval and these values are arranged successively across the output terminals of memory 202. Since maximum value $\{\delta'(N_{i+1})\}$ corresponds to input samples of a longer block length than the block length of input samples which are associated with maximum value $\{\delta'(N_i)\}$ as seen from FIG. 3B, Equation (4), when satisfied, indicates that there is a variation in the input digital samples. When this occurs, comparator 205 causes the maximum value $\{\delta'(N_{i+1})\}$ to be applied to a block length detector 206. In other words, the maximum value of smaller magnitude of, and larger block length of, the compared values is applied to detector 206. Detector 206 identifies the block length $N_{i+1}$ indicated by the signal from switch 203 as an optimum block length and supplies a signal indicative of the optimum block length to a selector 207. Alternatively, the other maximum value $\{\delta'(N_i)\}$ may be coupled to detector 206, instead of the maximum value $\{\delta'(N_{i+1})\}$, when Equation (4) is satisfied. If Equation (4) is not satisfied, comparator 204 enables gate 206 to apply a signal to selector 207, indicating that the block length $N_n$ is the optimum block length.

Rapid variation detector 300 includes a minimum block length detector 301 to search the contents of memory 91 for those corresponding to minimum block length (i.e., $N_i = N_1$) and applies the detected value to a respective location of a memory 302. A switch 302 is connected to the outputs of memory 302 and driven by a controller 304 to sequentially connect a successive pair of adjacent inputs from memory 302 to a divider 305. The latter calculates ratios between the adjacent values of each successive pair as follows:

$$\delta_p(1) = \delta'(N_{1(p+1)})/\delta'(N_{1(p)}) \tag{5-1}$$

$$\delta_p(1) = \delta'(N_{1(p)})/\delta'(N_{1(p+1)}) \tag{5-2}$$

where, $1 \leq p < S$, where S is the maximum number of $\delta'(N_1)$ values stored in memory 91 during a frame interval. The output $\delta_p(1)$ of divider 305 is applied to a threshold detector 306 to cause it to check to see if this signal exceeds a threshold value. If this is the case, detector 306 applies a signal to selector 207 indicating that the minimum block length $N_1$ is the optimum block length.

In the absence of a minimum block length signal from rapid variation detector 206, selector 207 couples the output of variation detector 208 to selector 17. If this minimum block length signal occurs, it is applied to selector 17 instead of the output of variation detector 208.

Figure 13:
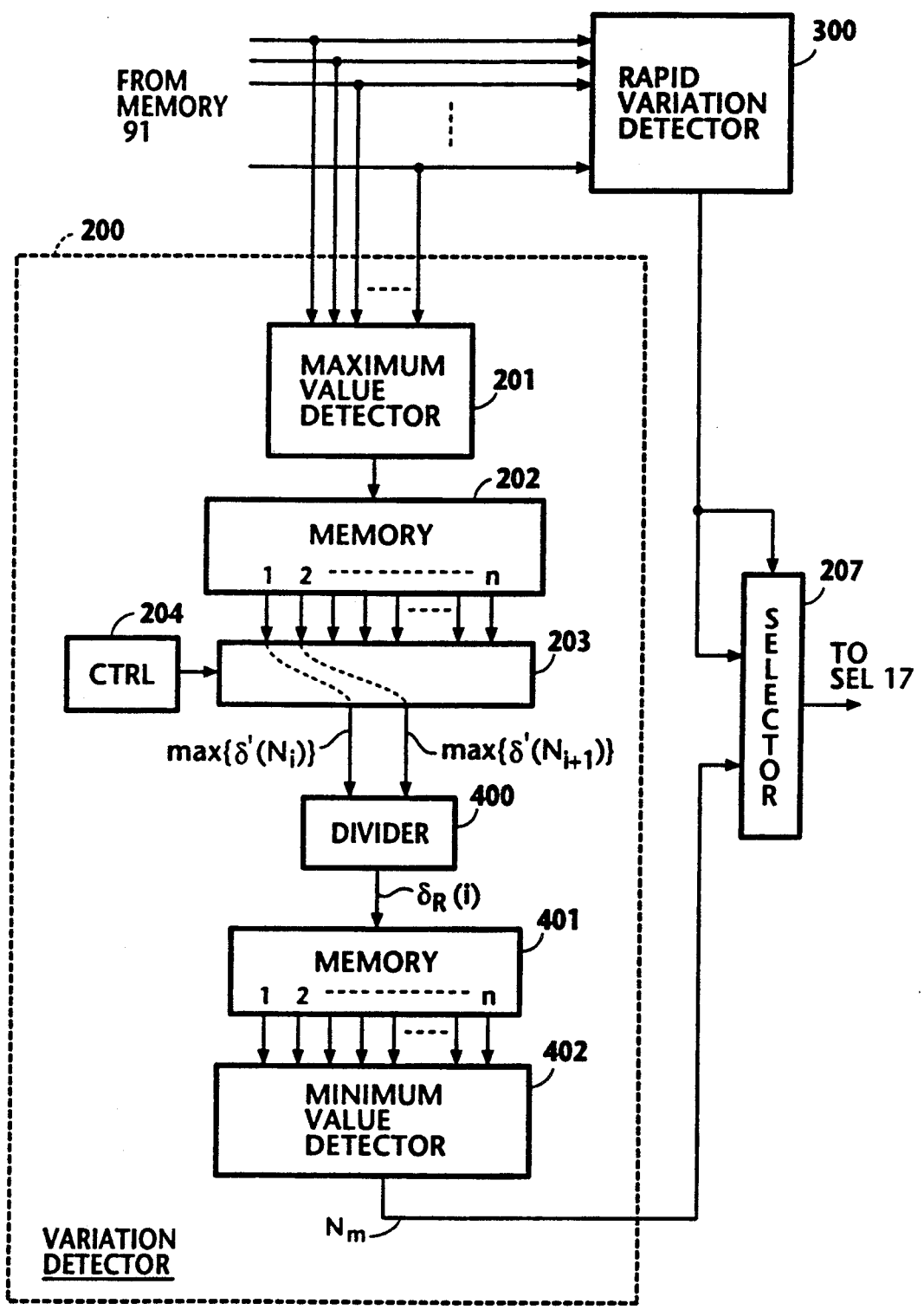
FIG. 13 shows in block form a modification of the optimum block length detector of FIG. 12.

FIG. 13 shows a modification of the variation detector 200 of FIG. 12. In this modification, a divider 400 is connected to the outputs of memory 202 to derive ratios between maximum values of adjacent sets by calculating the following Equation:

$$\delta_R(i) = \max\{\delta'(N_{i+1})\}/\max\{\delta'(N_i)\} \tag{6}$$

where $1 \leq i \leq n-1$. The derived ratios $\delta_R(i)$ are stored in respective locations of a memory 401. A minimum value detector 402 is connected to the outputs of memory 401 to search all ratios $\delta_R(i)$ for a minimum value $\min\{\delta_R(i)\}$, identifies the block length of the minimum ratio as an optimum block length $N_m$, and supplies a signal representative of the optimum block length to selector 207 as an output of the variation detector 200.

Figure 14:
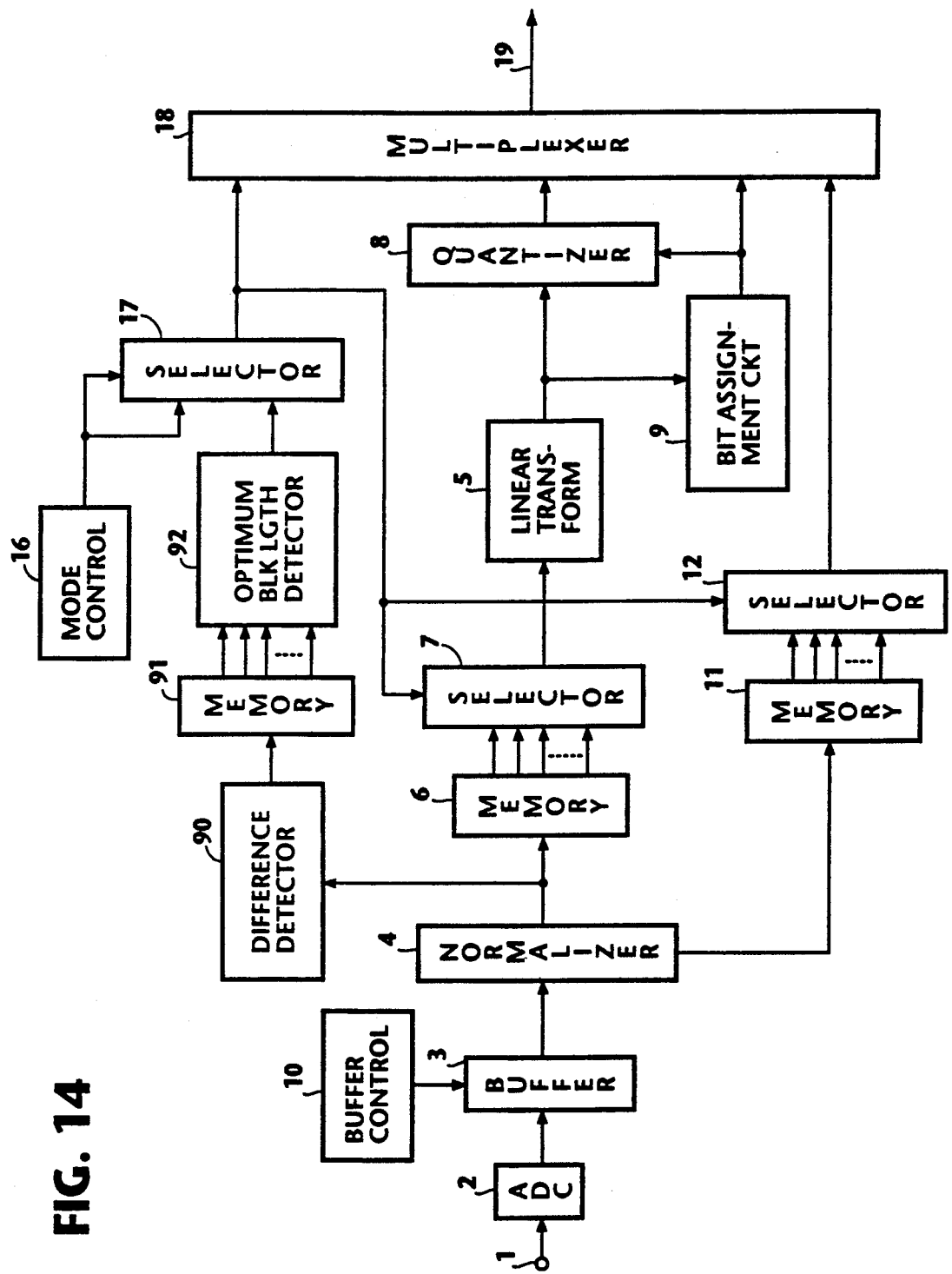
FIG. 14 shows in block form a third embodiment of the present invention.

From the foregoing it can be seen that squared sums of interblock differences can not only be derived from transform coefficients but also from normalized (or unnormalized) digital samples. Therefore, the embodiment of FIG. 10 can be modified as shown in FIG. 14 in which linear transform coder 5 is provided between selector 7 and quantizer 8 and the output of normalizer 4 is connected to memory 6 and to difference detector 90. Difference detector 90 processes normalized samples to derive squared sums of interblock differences between normalized samples in a manner identical to that described in connection with FIG. 10 in which transform coefficients are processed for deriving squared sums of interblock differences between transform coefficients. Optimum block length detector 92 operates in the same manner as before to generate an optimum block length signal for coupling through selector 17 to the control input of selector 7 to allow it to selectively couple one of the normalized samples of the optimum block length to linear transform coder 5.

Although the present invention has been described in relation to particular embodiments thereof, may other variations and modifications and other uses will become apparent to those skilled in the art. It is preferred, therefore, that the present invention be limited not by the specific disclosure herein, but only by the appended claims.

What is claimed is:

1. An adaptive transform coding method comprising:
   a) storing subblocks of input digital samples representing an audio-frequency signal in a buffer at predetermined intervals, reading the stored samples from the buffer and segmenting the samples from the buffer into a plurality of blocks each having an integral multiple of length of said subblock;
   b) encoding each of said blocks into corresponding transform coefficients and storing said transform coefficients in a memory;
   c) squaring each of said transform coefficients;
   d) summing those of said squared transform coefficients which correspond to high-frequency components of said input digital samples to produce squared sums;
   e) detecting a minimum of said squared sums as corresponding to an optimum block length;
   g) selecting those of said transform coefficients which correspond to said optimum block length from said memory; and
   h) multiplexing the selected transform coefficients with a block length signal representative of said optimum block length.

2. An adaptive transform coding method as claimed in claim 1, further comprising the steps of determining a step size from the transform coefficients selected by the step (g) and quantizing the selected transform coefficients according to said step size, and wherein the step (h) comprises multiplexing the quantized transform coefficients with a signal representative of said step size.

3. An adaptive transform coding method as claimed in claim 2, wherein the selected step size is determined by squaring said transform coefficients, taking an average value of a group of the squared transform coefficients of neighboring occurrences as a representative value of said group, providing interpolations between successive ones of said squared transform coefficients, and deriving said step size from the interpolated squared transform coefficients.

4. An adaptive transform coding method as claimed in claim 1, wherein the step (a) comprises organizing $2^{a+b}N$ samples read out of said buffer into $(m+1)$ groups of $2^a$ blocks of $2^bN$ samples each, where $a+b=m$, and $a$ is a variable in a range from $m$ to $0$ and $b$ is a variable in a range from $0$ to $m$, and where $m$ is equal to or greater than 2, and $N$ is an integer, each of said groups containing an equal number of samples of same arrivals.

5. An adaptive transform coding method as claimed in claim 1, further comprising deriving respective variances of said blocks, scaling said blocks according to the respective variances, storing said variances into a second memory, and selecting those variances corresponding to said optimum block length from said second memory, wherein the step (h) comprises multiplexing the selected transform coefficients with a signal representative of the selected variances.

6. An adaptive transform coding method as claimed in claim 1, further comprising generating a signal specifying a predetermined block length, wherein the step (g) comprises selecting those of said transform coefficients which correspond to said predetermined block length and the step (h) comprises multiplexing the transform coefficients selected as corresponding to said predetermined block length with a signal representative of said predetermined block length instead of with the signal representative of the optimum block length.

7. An adaptive transform coding method comprising:
   a) storing subblocks of input digital samples representing an audio-frequency signal into a buffer at frame intervals, reading the stored samples from the buffer and segmenting the samples from the buffer into a plurality of blocks each having an integral multiple of the length of said subblock;
   b) encoding each of said blocks into corresponding transform coefficients and storing said transform coefficients into a memory;
   c) detecting interblock differences between successive transform coefficients of equal block length;
   d) squaring each of said interblock differences;
   e) summing those of said squared interblock differences which correspond to equal block length to produce a set of squared sums of said interblock differences for each block length;
   f) detecting representative values of the squared sums from successive ones of said sets, detecting a variation between said representative values and identifying a block length corresponding to said variation as an optimum block length;
   g) selecting those of said transform coefficients which correspond to said optimum block length from said memory; and
   h) multiplexing the selected transform coefficients with a block length signal representative of said optimum block length.

8. An adaptive transform coding method as claimed in claim 7, wherein the step (f) comprises the steps of:
   detecting a maximum value of the squared sums from each set; and
   comparing said maximum values detected from a successive pair of said sets so that said compared values correspond respectively to longer and shorter block lengths and selecting one of the compared values as corresponding to said variation if the maximum value of the longer block length has a smaller maximum value than the maximum value of a shorter block length.

9. An adaptive transform coding method as claimed in claim 8, wherein the step (f) further comprises the steps of:
   detecting those of said squared sums from each frame interval which correspond to a minimum block length;
   dividing each of the detected squared sums with the detected squared sum of an adjacent occurrence to produce a plurality of ratios from each frame interval; and
   detecting one of said ratios as corresponding to said variation if said ratio exceeds a prescribed value.

10. An adaptive transform coding method as claimed in claim 7, wherein the step (f) comprises the steps of:
    detecting a maximum value of the squared sums from each set;
    dividing one of the maximum values of a successive pair by the other maximum value of the pair and deriving a plurality of ratios from a plurality of said pairs; and detecting a minimum value from said ratios as corresponding to said variation.

11. An adaptive transform coding method as claimed in claim 10, wherein the step (f) further comprises the steps of:
   detecting those of said squared sums from each frame interval which correspond to a minimum block length;
   dividing each of the detected squared sums with the detected squared sum of an adjacent occurrence to produce a plurality of ratios from each frame interval; and
   detecting one of said ratios as corresponding to said variation if said ratio exceeds a prescribed value.

12. An adaptive transform coding method as claimed in claim 7, further comprising the steps of determining a step size from the transform coefficients selected by the step (g) and quantizing the selected transform coefficients according to said step size, and the step (h) comprises multiplexing the quantized transform coefficients with a signal representative of said step size.

13. An adaptive transform coding method as claimed in claim 12, wherein said selected step size is determined by squaring said transform coefficients, taking an average value of a group of the squared transform coefficients of neighboring occurrences as a representative value of said group, providing interpolations between successive ones of said squared transform coefficients, and deriving said step size from the interpolated squared transform coefficients.

14. An adaptive transform coding method as claimed in claim 7, wherein the step (a) comprises organizing $2^{a+b}N$ samples read out of said buffer into $(m+1)$ groups of $2^a$ blocks of $2^bN$ samples each, where $a+b=m$, and a is a variable in a range from m to 0 and b is a variable in a range from 0 to m, and where m is equal to or greater than 2, and N is an integer, each of said groups containing an equal number of samples of same arrivals.

15. An adaptive transform coding method as claimed in claim 7, further comprising deriving respective variances of said blocks, scaling said blocks according to the respective variances, storing said variances into a second memory, and selecting those of said variances which correspond to said optimum block length from said second memory, wherein the step (h) comprising multiplexes multiplexing the selected transform coefficients with a signal representative of the selected variances.

16. An adaptive transform coding method as claimed in claim 7, further comprising generating a signal specifying a predetermined block length, wherein the step (g) comprises selecting those of said transform coefficients which correspond to said predetermined block length and the step (h) comprises multiplexing the transform coefficients selected as corresponding to said predetermined block length with a signal representative of the predetermined block length instead of with the signal representative of the optimum block length.

17. An adaptive transform coding method comprising:
   a) storing subblocks of input digital samples representing an audio-frequency signal in a buffer at frame intervals, reading the stored samples from the buffer and segmenting the samples from the buffer into a plurality of blocks each having an integral multiple of the length of said subblock;
   b) storing said blocks in a memory and detecting interblock differences between successive blocks of equal length;
   c) squaring each of said interblock differences;
   d) summing those of said squared interblock differences which correspond to equal block length to produce a set of squared sums of said interblock differences for each block length;
   e) detecting representative values of the squared sums from successive ones of said sets, detecting a variation between said representative values and identifying a block length corresponding to said variation as an optimum block length;
   f) selecting those of said blocks having said optimum block length from said memory;
   g) linearly encoding the selected blocks into corresponding transform coefficients; and
   h) multiplexing said transform coefficients with a block length signal representative of said optimum block length.

18. An adaptive transform coding method as claimed in claim 17, wherein the step (e) comprises the steps of:
   detecting a maximum value of the squared sums from each set; and
   comparing said maximum values detected from a successive pair of said sets so that said compared values correspond respectively to longer and shorter block lengths and selecting one of the compared values as corresponding to said variation if the maximum value of the longer block length has a smaller maximum value than the maximum value of a shorter block length.

19. An adaptive transform coding method as claimed in claim 18, wherein the step (e) further comprises the steps of:
   detecting those of said squared sums from each frame interval which corresponds to a minimum block length;
   dividing each of the detected squared sums with the detected squared sum of an adjacent occurrence to produce a plurality of ratios from each frame interval; and
   detecting one of said ratios as corresponding to said variation if said ratio exceeds a prescribed value.

20. An adaptive transform coding method as claimed in claim 17, wherein the step (e) comprises the steps of:
   detecting a maximum value of the squared sums from each set;
   dividing one of the maximum values of a successive pair by the other maximum value of the pair and deriving a plurality of ratios from a plurality of said pairs; and
   detecting a minimum value from said ratios as corresponding to said variation.

21. An adaptive transform coding method as claimed in claim 20, wherein the step (e) further comprises the steps of:
   detecting those of said squared sums from each frame interval which correspond to a minimum block length;
   dividing each of the detected squared sums with the detected squared sum of an adjacent occurrence to produce a plurality of ratios from each frame interval; and
   detecting one of said ratios as corresponding to said variation if said ratio exceeds a prescribed value.

22. An adaptive transform coding method as claimed in claim 17, further comprising the steps of determining a step size from the selected transform coefficients and quantizing said transform coefficients according to said step size, and wherein the step (h) comprises multiplexing quantized transform coefficients with a signal representative of said step size.

23. An adaptive transform coding method as claimed in claim 22, wherein said step size is determined by squaring the selected transform coefficients, taking an average value of a group of the squared transform coefficients of neighboring occurrences as a representative value of said group, providing interpolations between successive ones of said squared transform coefficients, and deriving said step size from the interpolated squared transform coefficients.

24. An adaptive transform coding method as claimed in claim 17, wherein the step (a) comprises reading samples out of said buffer and organizing $2^{a+b}$ N samples read out of said buffer into (m+1) groups of $2^a$ blocks of $2^b$ N samples each, where a+b=m, and a is a variable in a range from m to O and b is a variable in a range from O to m, and where m is equal to or greater than 2, and N is an integer, each of said groups containing an equal number of samples of same arrivals.

25. An adaptive transform coding method as claimed in claim 17, further comprising deriving respective variances of said blocks, scaling said blocks according to the respective variances, storing said variances into a second memory, and selecting those of said variances which correspond to said optimum block length from said second memory, wherein the step (h) comprises multiplexing the selected transform coefficients with a signal representative of the selected variances.

26. An adaptive transform coding method as claimed in claim 17, further comprising generating a signal specifying a predetermined block length, wherein the step (f) comprises selecting those blocks having said predetermined block length and the step (h) comprises multiplexing the transform coefficients selected as corresponding to said predetermined block length with a signal representative of the predetermined block length instead of with the signal representative of the optimum block length.

27. A data compression system comprising:
a buffer;
buffer control means for storing subblocks of input digital samples representing an audio-frequency signal in said buffer at predetermined intervals, reading the stored samples from the buffer and segmenting the samples from the buffer into a plurality of blocks each having an integral multiple of the length of said subblock;
a transform encoder for encoding each of said blocks into corresponding transform coefficients;
a memory for storing said transform coefficients therein;
optimum block length determination means for squaring each of said transform coefficients, summing those of said squared transform coefficients which correspond to high-frequency components of said input digital samples to produce squared sums, detecting a minimum of said squared sums as corresponding to an optimum block length, and selecting those of said transform coefficients which correspond to said optimum block length from said memory;
multiplexer means for multiplexing the selected transform coefficients with a signal representative of said optimum block length into a multiplex signal;
demultiplexer means for demultiplexing the multiplex signal into said transform coefficients and said block length signal; and
a transform decoder coupled to said demultiplexer means for decoding said demultiplexed transform coefficients in a process inverse to said transform encoder at intervals corresponding to the block length indicated by said demultiplexed block length signal.

28. A data compression system as claimed in claim 27, further comprising:
means for deriving variances of said blocks respectively and scaling the blocks with the respective variances; and
a second memory for storing said variances,
wherein said optimum block length determination means selects those of said variances which correspond to said optimum block length, and said multiplexer means multiplexes a signal representative of the selected variance with said selected transform coefficients.

29. A data compression system as claimed in claim 27, further comprising means for determining a step size from the selected transform coefficients and means for quantizing said selected transform coefficients according to said step size and causing said multiplexer means to multiplex a signal representative of said step size with the quantized transform coefficients.

30. A data compression system as claimed in claim 29, wherein said step size determination means comprises means for squaring said selected transform coefficients and taking an average value of a group of the squared transform coefficients of neighboring occurrences as a representative value of said group and causing said multiplexer means to multiplex the selected transform coefficients with a signal representative of said average value as said step size representative signal, means for providing interpolations between successive ones of said squared transform coefficients, deriving said step size from the interpolated squared transform coefficients and applying a signal representative of the derived step size to said quantizer means.

31. A data compression system as claimed in claim 27, wherein said buffer control means organizes $2^{a+b}$ N samples read out of said buffer into (m+1) groups of $2^a$ blocks of $2^b$ N samples each, where a+b=m, and a is a variable in a range from m to 0 and b is a variable in a range from 0 to m, and where m is equal to or greater than 2, and N is an integer, each of said groups containing an equal number of samples of same arrivals.

32. A data compression system as claimed in claim 31, further comprising a normalizer for deriving respective variances of said blocks, and scaling said blocks according to the respective variances, a second memory for storing said variances therein, wherein said optimum block length determination means selects those variances corresponding to said optimum block length from said second memory, and wherein said multiplexer means multiplexes the selected transform coefficients with a signal representative of the selected variances.

33. A data compression system as claimed in claim 27, further comprising means for generating a signal specifying a predetermined block length and means for selecting those of said transform coefficients which correspond to said predetermined block length from said memory and causing said multiplexer means to multiplex the transform coefficients selected as corresponding to said predetermined block length with a signal representative of said predetermined block length instead of with the signal representative of the optimum block length.

34. A data compression system comprising:
a buffer;
buffer control means for storing subblocks of input digital samples representing an audio-frequency signal in said buffer at frame intervals, reading the stored samples from the buffer and segmenting the samples from the buffer into a plurality of blocks each having an integral multiple of the length of said subblock;
a transform encoder for encoding said blocks into respective transform coefficients;
a memory for storing said transform coefficients therein;
optimum block length determination means for detecting interblock differences between successive transform coefficients of equal block length, squaring each of said interblock differences, summing those squared interblock differences corresponding to equal block length to produce a set of said squared sums for each block length, detecting representative values of the squared sums from successive ones of said sets, detecting a variation between said representative values and identifying a block length corresponding to said variation as an optimum block length, and selecting those of the transform coefficients having said optimum block length from said memory;
multiplexer means for multiplexing the selected transform coefficients with a signal representative of said optimum block length into a multiplex signal;
demultiplexer means for demultiplexing the multiplex signal into said transform coefficients and said block length signal; and
a transform decoder coupled to said demultiplexer means for decoding said demultiplexed transform coefficients in a process inverse to said transform encoder at intervals corresponding to the block length indicated by said demultiplexed block length signal.

35. A data compression system as claimed in claim 34, wherein the optimum block length determination means comprises:
means for detecting a maximum value of the squared sums from each set; and
means for comparing said maximum values detected from a successive pair of said sets so that said compared values correspond respectively to longer and shorter block lengths and selecting one of the compared values as corresponding to said variation if the maximum value of the longer block length has a smaller maximum value than the maximum value of a shorter block length.

36. A data compression system as claimed in claim 35, wherein the optimum block length determination means further comprises:
means for detecting those of said squared sums from each frame interval which correspond to a minimum block length;
means for dividing each of the detected squared sums with the detected squared sum of an adjacent occurrence to produce a plurality of ratios from each frame interval; and
means for detecting one of said ratios as corresponding to said variation if said ratio exceeds a prescribed value.

37. A data compression system as claimed in claim 34, wherein the optimum block length determination means comprises:
means for detecting a maximum value of the squared sums from the different sets of each frame interval and deriving a plurality of said maximum values during each frame interval; and
means for forming the maximum value derived from each set with the maximum value of an adjacent set into a pair and deriving a plurality of successive pairs from successive frame intervals;
means for dividing one of the maximum values of each of said pairs by the other maximum value of the pair and deriving a plurality of ratios from said pairs; and
means for detecting a minimum value from said ratios as corresponding to said variation.

38. A data compression system as claimed in claim 37, wherein the optimum block length determination means further comprises:
means for detecting those of said squared sums from each frame interval which correspond to a minimum block length;
means for dividing each of the detected squared sums with the detected squared sum of an adjacent occurrence to produce a plurality of ratios from each frame interval; and
means for detecting one of said ratios as corresponding to said variation if said ratio exceeds a prescribed value.

39. A data compression system as claimed in claim 34, further comprising a normalizer for deriving respective variances of said blocks, and scaling said blocks according to the respective variances, a second memory for storing said variances therein, wherein said optimum block length determination means selects those variances corresponding to said optimum block length from said second memory, and wherein said multiplexer means multiplexes the selected transform coefficients with a signal representative of the selected variances.

40. A data compression system as claimed in claim 34, further comprising means for determining a step size from the selected transform coefficients and means for quantizing said selected transform coefficients according to said step size and causing said multiplexer means to multiplex a signal representative of said step size with the quantized transform coefficients.

41. A data compression system as claimed in claim 40, wherein said step size determination means comprises means for squaring said selected transform coefficients and taking an average value of a group of the squared transform coefficients of neighboring occurrences as a representative value of said group and causing said multiplexer means to multiplex the selected transform coefficients with a signal representative of said average value as said step size representative signal, means for providing interpolations between successive ones of said squared transform coefficients, deriving said step size from the interpolated squared transform coefficients and applying a signal representative of the derived step size to said quantizer means.

42. A data compression system as claimed in claim 34, wherein said buffer control means reads out the samples stored in said buffer and organizes $2^{a+b}N$ samples read out of said buffer into $(m+1)$ groups of $2^a$ blocks of $2^b N$ samples each, where $a+b=m$, and a is a variable in a range from m to 0 and b is a variable in a range from 0 to m, and where m is equal to or greater than 2, and N is an integer, each of said groups containing an equal number of samples of same arrivals.

43. A data compression system as claimed in claim 34, further comprising means for generating a signal specifying a predetermined block length and means for selecting those of said transform coefficients which correspond to said predetermined block length from said memory and causing said multiplexer means to multiplex the transform coefficients selected as corresponding to said predetermined block length with a signal representative of said predetermined block length instead of with the signal representative of the optimum block length.

44. A data compression system comprising:
a buffer;
buffer control means for storing subblocks of input digital samples representing an audio-frequency signal into said buffer at predetermined intervals, reading the stored samples from the buffer and segmenting the samples from the buffer into a plurality of blocks each having an integral multiple of the length of said subblock;
a memory for storing said blocks therein;
optimum block length determination means for detecting interblock differences between successive blocks of equal block length, squaring each of said interblock differences, summing those squared interblock differences corresponding to equal block length to produce a set of said squared sums for each block length, detecting representative values of the squared sums from successive ones of said sets, detecting a variation between said representative values and identifying a block length corresponding to said variation as an optimum block length, and selecting those of the blocks having said optimum block length from said memory;
a transform encoder for encoding said selected blocks into respective transform coefficients;
multiplexer means for multiplexing the transform coefficients with a signal representative of said optimum block length into a multiplex signal;
demultiplexer means for demultiplexing the multiplex signal into said transform coefficients and said block length signal; and
a transform decoder coupled to said demultiplexer means for decoding said demultiplexed transform coefficients in a process inverse to said transform encoder at intervals corresponding to the block length indicated by said demultiplexed block length signal.

45. A data compression system as claimed in claim 44, wherein the optimum block length determination means comprises:
means for detecting a maximum value of the squared sums from the different sets of each frame interval; and
means for comparing between said maximum values detected from a successive pair of said sets so that said compared values correspond respectively to longer and shorter block lengths and selecting one of the compared values as corresponding to said variation if the maximum value of the longer block length has a smaller maximum value than the maximum value of a shorter block length.

46. A data compression system as claimed in claim 45, wherein the optimum block length determination means further comprises:

means for detecting those of said squared sums from each frame interval which correspond to a minimum block length;
means for dividing each of the detected squared sums with the detected squared sum of an adjacent occurrence to produce a plurality of ratios from each frame interval; and
means for detecting one of said ratios as corresponding to said variation if said ratio exceeds a prescribed value.

47. A data compression system as claimed in claim 44, wherein the optimum block length determination means comprises:
means for detecting a maximum value of the squared sums from the different sets of each frame interval and deriving a plurality of said maximum values during each frame interval; and
means for forming the maximum value derived from each set with the maximum value of an adjacent set into a pair and deriving a plurality of successive pairs from successive frame intervals;
means for dividing one of the maximum values of each of said pairs by the other maximum value of the pair and deriving a plurality of ratios from said pairs; and
means for detecting a minimum value from said ratios as corresponding to said variation.

48. A data compression system as claimed in claim 47, wherein the optimum block length determination means further comprises:
means for detecting those of said squared sums from each frame interval which correspond to a minimum block length;
means for dividing each of the detected squared sums with the detected squared sum of an adjacent occurrence to produce a plurality of ratios from each frame interval; and
means for detecting one of said ratios as corresponding to said variation if said ratio exceeds a prescribed value.

49. A data compression system as claimed in claim 44, further comprising a normalizer for deriving respective variances of said blocks, and scaling said blocks according to the respective variances, a second memory for storing said variances therein, wherein said optimum block length determination means selects those variances corresponding to said optimum block length from said second memory, and wherein said multiplexer means multiplexes the selected transform coefficients with a signal representative of the selected variances.

50. A data compression system as claimed in claim 44, further comprising means for determining a step size from the transform coefficients derived from said selected blocks and means for quantizing said transform coefficients according to said step size and causing said multiplexer means to multiplex a signal representative of said step size with the quantized transform coefficients.

51. A data compression system as claimed in claim 50, wherein said step size determination means comprises means for squaring said transform coefficients derived from said selected blocks and taking an average value of a group of the squared transform coefficients of neighboring occurrences as a representative value of said group and causing said multiplexer means to multiplex the transform coefficients derived from said selected blocks with a signal representative of said average value as said step size representative signal, means for providing interpolations between successive ones of said squared transform coefficients, deriving said step size from the interpolated squared transform coefficients and applying a signal representative of the derived step size to said quantizer means.

52. A data compression system as claimed in claim 44, wherein said buffer control means organizes $2^{a+b}$ N samples read out of said buffer into (m+1) groups of $2^a$ blocks of $2^b$ N samples each, where a+b=m, and a is a variable in a range from m to 0 and b is a variable in a range from 0 to m, and where m is equal to or greater than 2, and N is an integer, each of said groups containing an equal number of samples of same arrivals.

53. A data compression system as claimed in claim 44, further comprising means for generating a signal specifying a predetermined block length and means for selecting those of said transform coefficients which correspond to said predetermined block length from said memory and causing said multiplexer means to multiplex the transform coefficients selected as corresponding to said predetermined block length with a signal representative of said predetermined block length instead of with the signal representative of the optimum block length.

* * * * *